(12) United States Patent
Takagi

(10) Patent No.: US 7,183,870 B2
(45) Date of Patent: Feb. 27, 2007

(54) RESONANT CIRCUIT AND A VOLTAGE-CONTROLLED OSCILLATOR

(75) Inventor: Kotaro Takagi, Kanagawa (JP)

(73) Assignee: Sony Ericsson Mobile Communications Japan, Inc., Tokyo (JP)

(*) Notice: Subject to any disclaimer, the term of this patent is extended or adjusted under 35 U.S.C. 154(b) by 0 days.

(21) Appl. No.: 10/893,955

(22) Filed: Jul. 20, 2004

(65) Prior Publication Data

US 2005/0030116 A1   Feb. 10, 2005

(30) Foreign Application Priority Data

Aug. 8, 2003  (JP)  ............. P2003-290145

(51) Int. Cl.
 *H03B 1/00* (2006.01)
(52) U.S. Cl. ............... 331/177 V; 331/179; 331/36 C; 331/117 R; 331/117 FE
(58) Field of Classification Search ........... 331/177 V, 331/117 R, 117 FE, 179, 36 C, 167
 See application file for complete search history.

(56) References Cited

U.S. PATENT DOCUMENTS

| | | | |
|---|---|---|---|
| 6,509,805 B2 * | 1/2003 | Ochiai ............... | 331/117 FE |
| 6,906,596 B2 * | 6/2005 | Kitamura et al. ......... | 331/36 C |
| 6,917,248 B2 * | 7/2005 | Nguyen .................. | 331/117 R |
| 2001/0035797 A1 | 11/2001 | Gutierrez ............. | 331/117 FE |
| 2002/0014925 A1 | 2/2002 | Ochiai .................. | 331/117 FE |
| 2003/0078016 A1 | 4/2003 | Groe et al. .................. | 455/91 |

FOREIGN PATENT DOCUMENTS

| | | |
|---|---|---|
| WO | WO 03/061108 | 7/2003 |
| WO | WO 03/075451 | 9/2003 |

OTHER PUBLICATIONS

Julien Mira, et al., "Distributed MOS Varactor Biasing for VCO Gain Equalization in 0.13 μm CMOS Technology", IEEE Radio Frequency Integrated Circuits Symposium, XP-002304724, 2004, pp. 131-134.
Francesco Svelto, et al., "A Bond-Wire Inductor-MOS Varactor VCO Tunable From 1.8 to 2.4 GHz", IEEE Transactions on Microwave Theory and Techniques, vol. 50, No. 1, XP-001085561, Jan. 2002, pp. 403-407.

* cited by examiner

*Primary Examiner*—Arnold Kinkead
(74) *Attorney, Agent, or Firm*—Oblon, Spivak, McClelland, Maier & Neustadt, P.C.

(57) ABSTRACT

A voltage-controlled oscillator comprising a resonant circuit and MOS transistors which constitute a negative resistance circuit of a differential structure. The resonant circuit consists of an inductance element and a MOS variable capacitance element connected in parallel therewith. The MOS variable capacitance element is divided into plural pairs connected in parallel with each other. A voltage division circuit generates staircase different-step DC bias voltages to be applied respectively to the gates of the plural divided MOS transistors. The divided MOS variable capacitance elements have a common terminal to which a common control voltage is applied. The resonant circuit is capable of reducing a load on the control voltage generator and improving the characteristics of the voltage-controlled oscillator.

8 Claims, 15 Drawing Sheets

1/4 DIVIDED CONNECTION OF TRANSISTORS IN FIG. 7A

BALANCED CONNECTION OF TWO TRANSISTORS IN FIG. 6A

VARIABLE CAPACITANCE CIRCUIT
WITH SINGLE TRANSISTOR

VARIABLE CAPACITANCE CIRCUIT WITH
SUBDIVIDED TRANSISTORS

MOS CAPACITANCE CHANGE CHARACTERISTIC

COMPOSITE CAPACITANCE CHANGE CHARACTERISTIC AND EQUIVALENT CIRCUIT

STAIRCASE DC POTENTIAL GENERATOR CIRCUIT

EQUIVALENT CIRCUIT

MOS VARIABLE CAPACITANCE CIRCUIT

F I G. 1 4
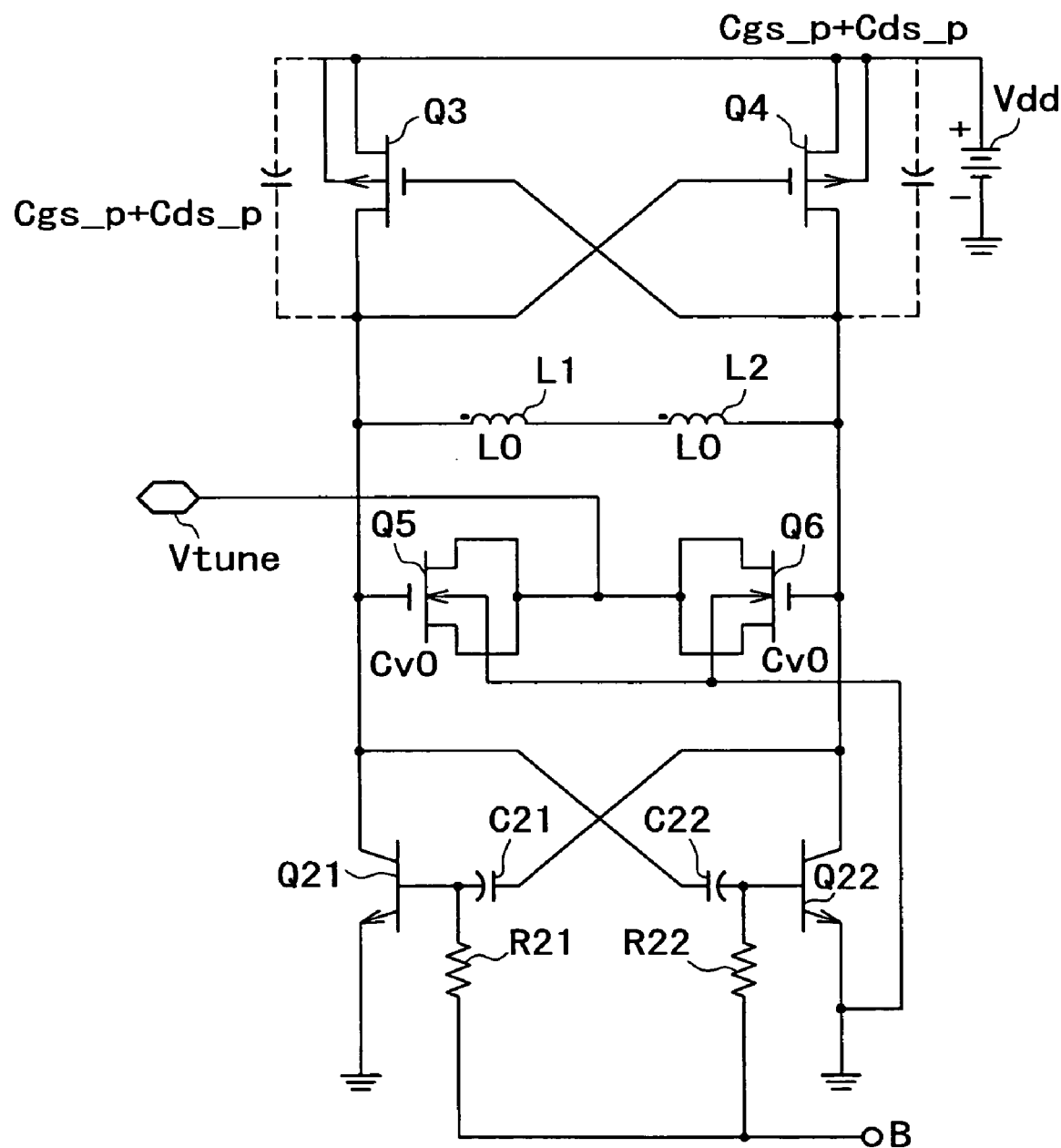

RESONANT CIRCUIT AND A VOLTAGE-CONTROLLED OSCILLATOR

BACKGROUND OF THE INVENTION

The present invention relates to a resonant circuit comprising an induction element and a MOS (Metal Oxide Semiconductor) variable capacitance element connected in parallel with the induction element, and also relates to a voltage-controlled oscillator using such a resonant circuit.

FIG. 1 shows a circuit configuration of an LC resonance type voltage-controlled oscillator used in general. In this configuration, an LC resonant circuit 10 comprising nMOS transistors Q5, Q6 and inductance elements L1, L2 is connected to a first negative resistance circuit consisting of nMOS transistors Q1 and Q2, and also to a second negative resistance circuit consisting of PMOS transistors Q3 and Q4, wherein the voltage-controlled oscillator can be driven to oscillate at the resonance frequency of the resonant circuit. The MOS transistors Q5 and Q6 constitute a variable capacitance element whose capacitance value is varied by controlling a DC voltage applied to the gates of the MOS transistors Q5 and Q6. The drains and sources of the MOS transistors Q5 and Q6 are connected in common mutually and are connected to a control terminal Vtune. The capacitance can be varied by changing the DC voltage at the terminal Vtune through utilizing the characteristics of such MOS transistors, hence controlling the oscillation frequency of the oscillator.

[Cited patent reference 1]

Japanese Patent Laid-open No. 2002-43842

FIG. 2 shows the respective capacitances and inductances in the component parts of the oscillator shown in FIG. 1. Each of the PMOS transistors Q3 and Q4 has a capacitance Cgs_p+Cds_p corresponding to a sum of the gate-source capacitance and the drain-source capacitance thereof, as shown in the diagram. Each of the inductance elements L1 and L2 has an inductance L0. Each of the nMOS transistors Q5 and Q6 has a variable capacitance Cv0 between the gate and the drain-source and has a capacitance Cgs+Cds corresponding to a sum of the gate-source capacitance and the drain-source capacitance thereof, and also has a parasitic capacitance Cparasitic which is a capacitance to the ground due to wiring.

FIG. 3 shows an equivalent circuit representing the resonant circuit in the oscillator of FIG. 2. As shown in FIG. 3, the resonant circuit has an inductance L0 based on L1 and L2, a capacitance Cp0 composed of the parasitic capacitance derived from the wiring of the circuit and the capacitance incidental to the MOS transistors constituting the negative resistance circuit, a variable capacitance Cv due to the MOS transistors, and an equivalent parallel resistance Rp of the resonant circuit 10.

The equivalent circuit of FIG. 3 can be simplified as shown in FIG. 4, wherein:

$Cv = Cv0/2$ $Lp = 2 \cdot L0$ $Cp = (Cgs+Cds)/2 + (Cgs\_p+Cds\_p)/2 + Cparasitic/2$ FIG. 5 graphically shows an exemplary characteristic of the equivalent parallel resistance Rp and the variable capacitance Cv of the MOS transistors varied in accordance with the DC control voltage Vtune. As shown in this graph, the equivalent parallel resistance Rp changes sharply in response to the DC control voltage Vtune. And the inclination of the capacitance variation curve within the range of the control voltage is also steep. Particularly the equivalent parallel resistance Rp of the variable capacitance element affects the Q of the resonant circuit considerably, and the characteristic of the oscillation circuit is changed with a change of the Q value caused by the control voltage. Since the phase noise of the oscillator is rendered worse in general when the Q of the resonant circuit is low, the characteristic shown in FIG. 5 signifies that there exists a point where the phase noise characteristic of the voltage-controlled oscillator is extremely deteriorated depending on the frequency. In the example of FIG. 5, the deterioration of the phase noise resulting from a fall of the Q becomes maximum at the oscillation frequency generated by the control voltage to obtain the minimum value Rpmin of the equivalent parallel resistance Rp.

In the Cited patent reference 1, there is disclosed an LC resonant circuit having MOS type varactors of voltage-controlled variable capacitance elements connected in parallel, wherein staircase control voltages are generated by dividing the control voltage, and the staircase control voltages are applied respectively to the control electrodes of the plural MOS type varactors; and there is also disclosed a voltage-controlled oscillator employing such LC resonant circuit. According to this structure, any variation caused in the capacitance due to a change of the control voltage can be rendered gentler to consequently widen the allowable amplitude of the control voltage for the voltage-controlled oscillator.

However, according to this related art disclosed in the Cited patent reference 1, an output end of an external control voltage generator is grounded via a series connection of plural MOS transistors and resistors serving as a voltage drop means, and a staircase control voltage is generated from each midpoint of the connection. Therefore, in this structure, a current keeps flowing continuously from the control voltage generator into the voltage drop means. Generally, a charge pump circuit is employed as the control voltage generator. Accordingly, there exists a problem that the voltage drop means used for generating such staircase control voltages becomes a heavy load on the charge pump circuit. That is, ideally, a DC input impedance of the controlled circuit is desired to be infinite as viewed from the output end of the charge pump circuit, but a problem arises actually that such an ideal is not attainable in the known structure based on the above related art.

SUMMARY OF THE INVENTION

The present invention has been accomplished with the background mentioned. It is therefore an object of the invention to provide a resonant circuit and a voltage-controlled oscillator employing such a resonant circuit, wherein the quantity of deterioration caused at the deterioration point of the aforementioned Q can be suppressed, and the inclination of the variable capacitance curve is relatively flattened to thereby improve the characteristics of the voltage-controlled oscillator as well as to reduce the load on the control voltage generator.

According to one aspect of the present invention, there is provided a resonant circuit comprising an induction element and a MOS variable capacitance element connected in parallel with the inductance element. In this circuit, the MOS variable capacitance element is subdivided into a plurality of elements which are connected in parallel with each other, and a plurality of bias terminals are formed for applying staircase different-step DC bias voltages to gates of MOS transistors constituting the divided MOS variable capacitance elements, wherein the plural MOS variable capacitance elements have a common terminal to which a common control voltage is applied.

Thus, the MOS variable capacitance element is subdivided into a plurality of elements, and staircase different-step DC bias voltages are applied respectively to the gates of the MOS transistors constituting the plural subdivided MOS variable capacitance elements, so that the capacitance variation characteristics due to the individual subdivided MOS transistors are offset to the control voltage. As a result, any sharp variation of the capacitance to the control voltage can be alleviated to consequently widen the variable voltage range. Further, the equivalent parallel resistance variation characteristics of the MOS variable capacitance elements composed of the individual subdivided MOS transistors can be offset to the control voltage, thereby enlarging the minimum value of the equivalent parallel resistance to eventually improve the Q.

Each of the subdivided MOS variable capacitance elements consists of a pair of MOS transistors whose drains and sources are connected in common, and the common control voltage is applied to the drain-source junction. Differing from the related art described in the Cited patent reference 1, the control voltage is applied directly to the drain-source common junction without being passed through any voltage division means, so that the DC input impedance of the resonant circuit is rendered substantially infinite as viewed from the control voltage generator, thereby preventing a flow of the direct current to consequently eliminate the known problem that a heavy load is imposed on the control voltage generator as observed in the conventional art.

And according to another aspect of the present invention, there is provided a voltage-controlled oscillator which comprises a resonant circuit having an inductance element and a MOS variable capacitance element connected in parallel therewith, and a negative resistance circuit of a differential structure connected to the resonant circuit, wherein the MOS variable capacitance element consists of a plurality of subdivided MOS variable capacitance elements connected in parallel mutually and having a common terminal to which a common control voltage is applied, and a bias voltage generator means is included for generating staircase different-step DC bias voltages to be applied respectively to the gates of the MOS transistors constituting the plural subdivided MOS variable capacitance elements.

In this voltage-controlled oscillator, the negative resistance circuit of a differential structure is connected to the resonant circuit, and the means for generating staircase different-step DC bias voltages is included to apply the generated bias voltages to the respective gates of the MOS transistors that constitute the plural subdivided MOS variable capacitance elements. Thus, as described, the resonant circuit is capable of alleviating any sharp variation of the capacitance to the control voltage, hence widening the variable voltage range. Further, the minimum value of the equivalent parallel resistance can be increased to consequently improve the Q.

A fixed capacitance needs to be inserted between the junction of each of the divided MOS variable capacitance elements and the negative resistance circuit and the gate of each of the divided MOS variable capacitance elements, whereby each of the subdivided MOS variable capacitance elements is separated from the DC voltage applied to the negative resistance circuit.

The negative resistance circuit has a pair of MOS transistors for example, wherein the drain of one MOS transistor is connected to the gate of the other MOS transistor, and the drains of both MOS transistors are connected to the differential output end of the resonant circuit. Meanwhile, a second negative resistance circuit may also be connected between a power supply and the resonant circuit, hence further enhancing the conditions of oscillation.

Summarizing the present invention, the following advantageous effects are achievable.

(1) The phase noise of the voltage-controlled oscillator can be improved.
(2) The voltage control sensitivity (Kv) of the voltage-controlled oscillator dependent on the physical characteristic of the MOS variable capacitance element is rendered adjustable by selection of the bias voltage.
(3) The variable capacitance element used in the present invention may consist of a MOS transistor, so that it can be composed easily within an IC chip to consequently realize improvements without any extreme increase of the power consumption.
(4) For attaining multi-step adjustment of the DC bias to the divided MOS variable capacitance elements, staircase DC bias voltages are applied to the gates of the MOS transistors respectively, and the control voltage is applied directly to the drain-source junction of each MOS transistor without being passed through any voltage division means, whereby the DC input impedance of the resonant circuit is rendered substantially infinite as viewed from the control voltage generator, hence preventing a heavy load on the control voltage generator differently from the conventional art.

The above and other features and advantages of the present invention will become apparent from the following description which will be given with reference to the illustrative accompanying drawings.

BRIEF DESCRIPTION OF THE DRAWINGS

FIG. 14 is a circuit diagram for explaining a further modification of the voltage-controlled oscillator according to the invention.

DETAILED DESCRIPTION OF THE PREFERRED EMBODIMENT

Hereinafter some preferred embodiment of the present invention will be described in detail with reference to the accompanying drawings.

Figure 5:
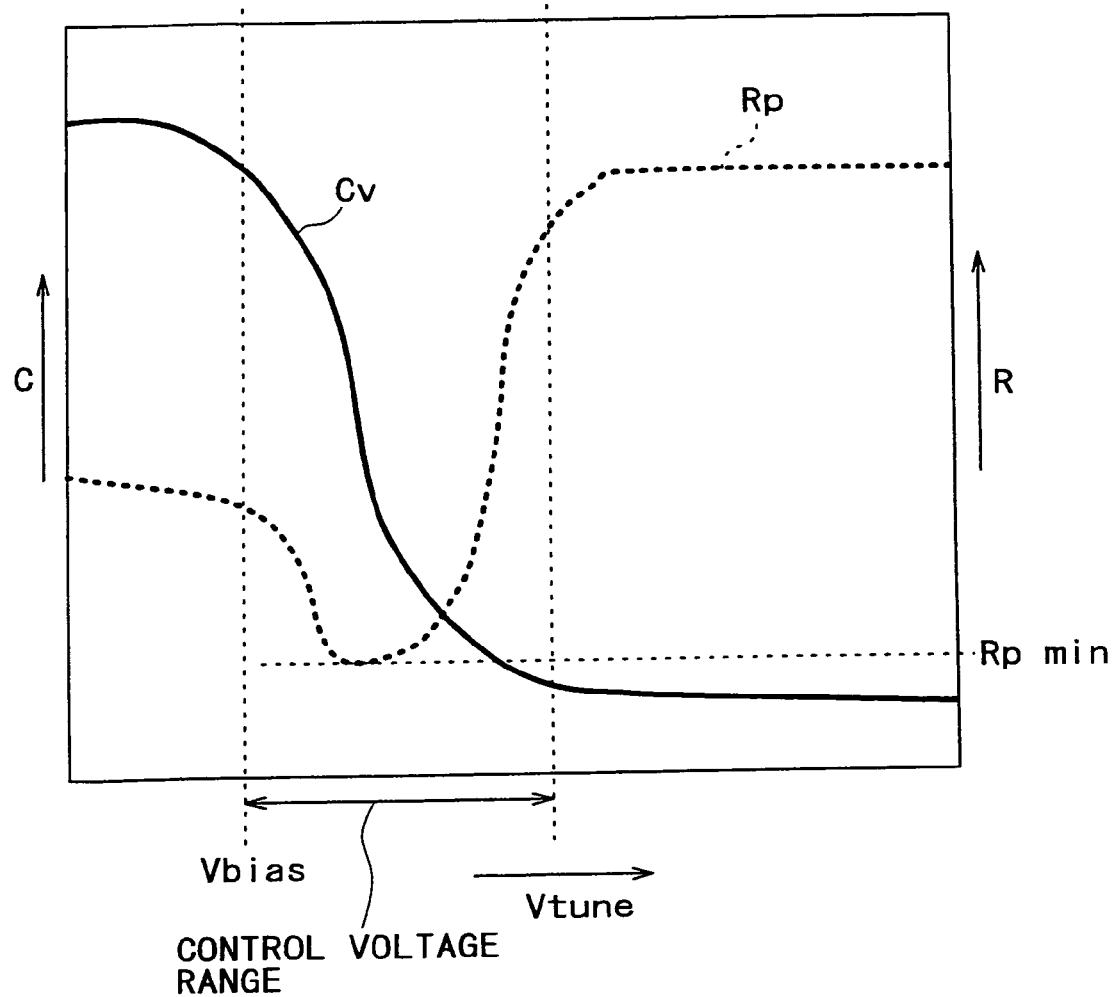
FIG. 5 graphically shows a characteristic example representing the variable capacitance Cv due to a MOS transistor and the equivalent parallel resistance Rp changed in accordance with a DC control voltage Vtune.

As shown in FIG. 5, the capacitance value of a MOS variable capacitance element consisting of MOS transistors Q5 and Q6 (FIG. 1) is varied very gently until immediately before the potential difference between the gate and the drain-source reaches the threshold voltage (Vth) of each transistor, and then is reduced steeply in the vicinity of the threshold voltage Vth.

Figure 6B:
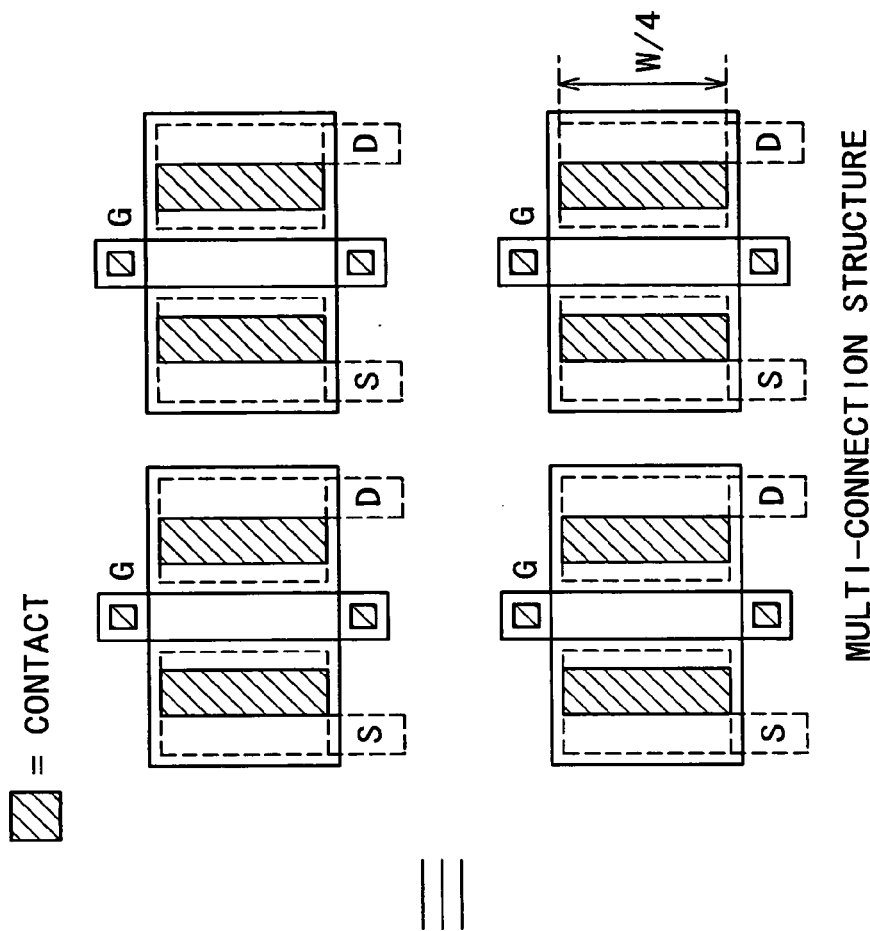
FIGS. 6A and 6B are diagrams showing, respectively, a single structure of a MOS transistor and a multi-connection structure thereof.
Figure 6A:
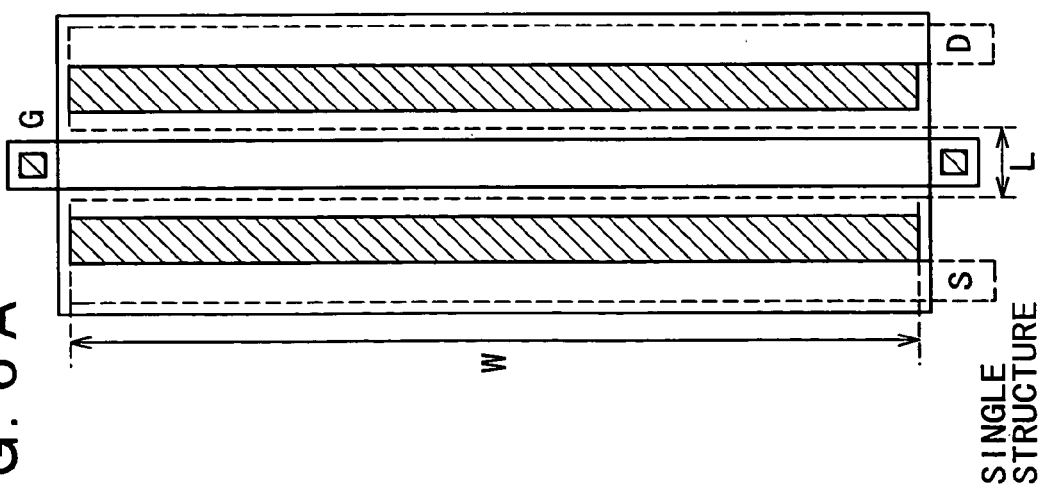
Figure 7B:
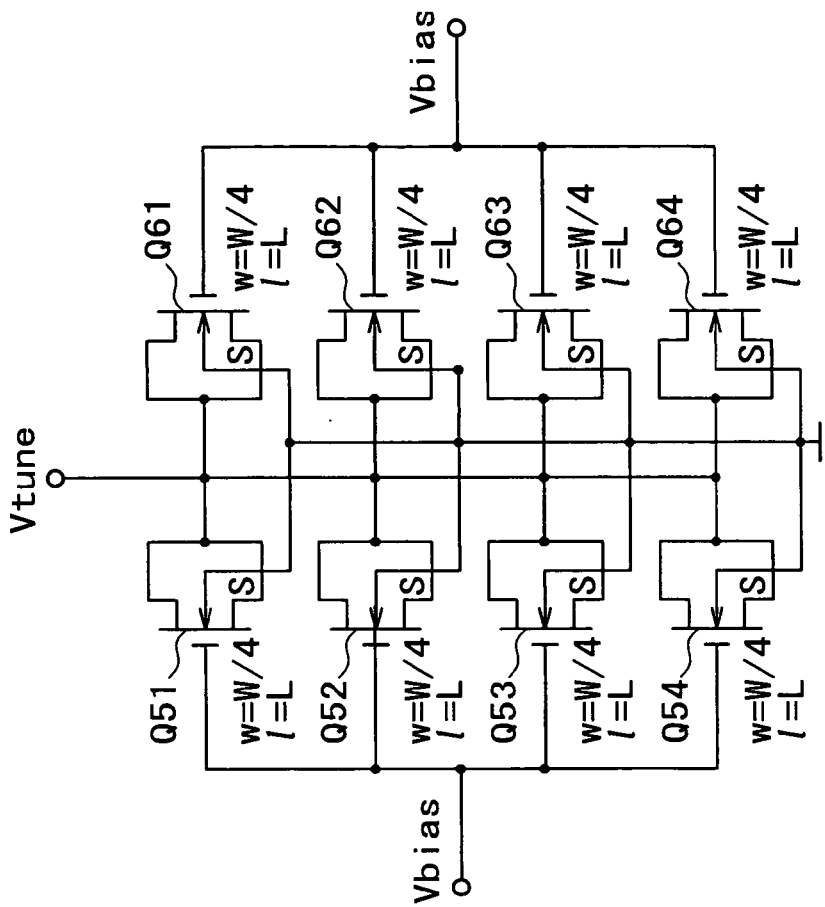
FIGS. 7A and 7B are circuit diagrams showing, respectively, the structure of FIG. 6A and that of FIG. 6B with individual circuit configurations.
Figure 7A:
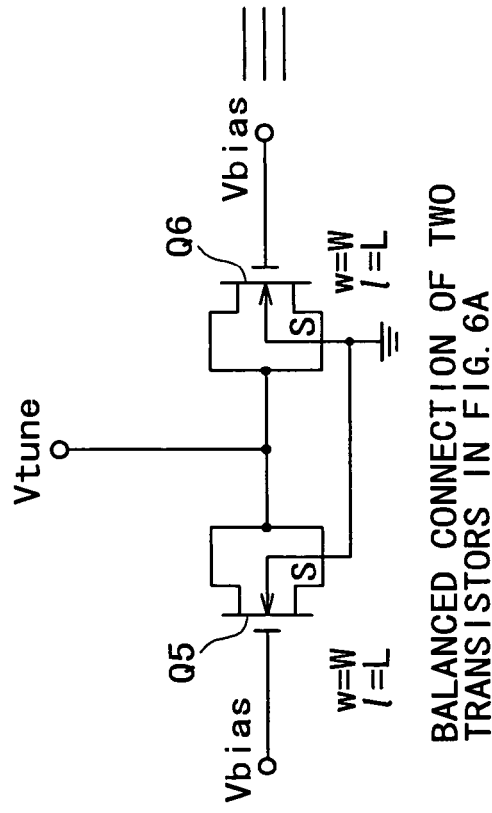

FIGS. 6A and 6B show structural examples of a MOS transistor. Generally, one MOS transistor (FIG. 6A) having such variable capacitance characteristic as shown in FIG. 5 is divided into a group of nMOS transistors smaller in size (FIG. 6B), and the entire divided transistors are connected in parallel mutually to constitute substantially equal variable capacitance circuits. FIGS. 7A and 7B show, respectively, the structure of FIG. 6A and that of FIG. 6B with circuit configurations. More specifically, a pair of MOS transistors Q5 and Q6 can be subdivided into four pairs of parallel-connected MOS transistors Q51, Q61; Q52, Q62; Q53, Q63; and Q54, Q64.

Figure 8A:
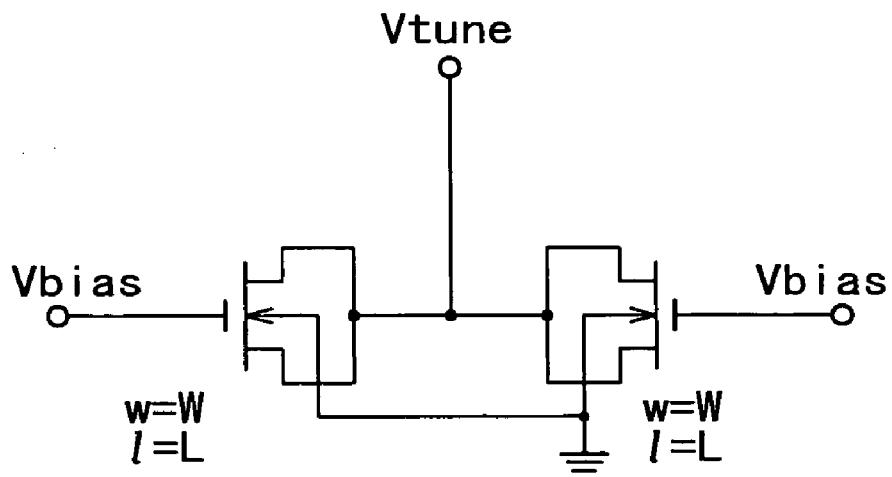
FIGS. 8A and 8B are circuit diagrams showing, respectively, a variable capacitance circuit consisting of a single transistor, and a variable capacitance circuit consisting of subdivided transistors.
Figure 8B:
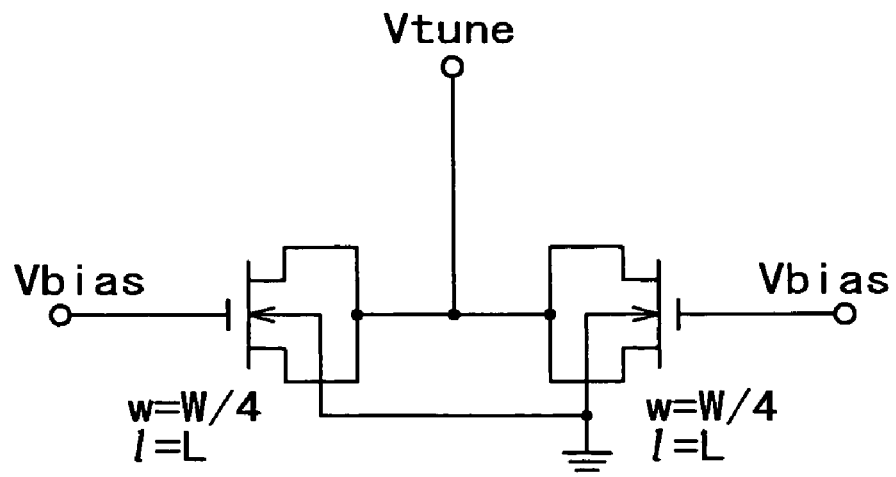
Figure 8C:
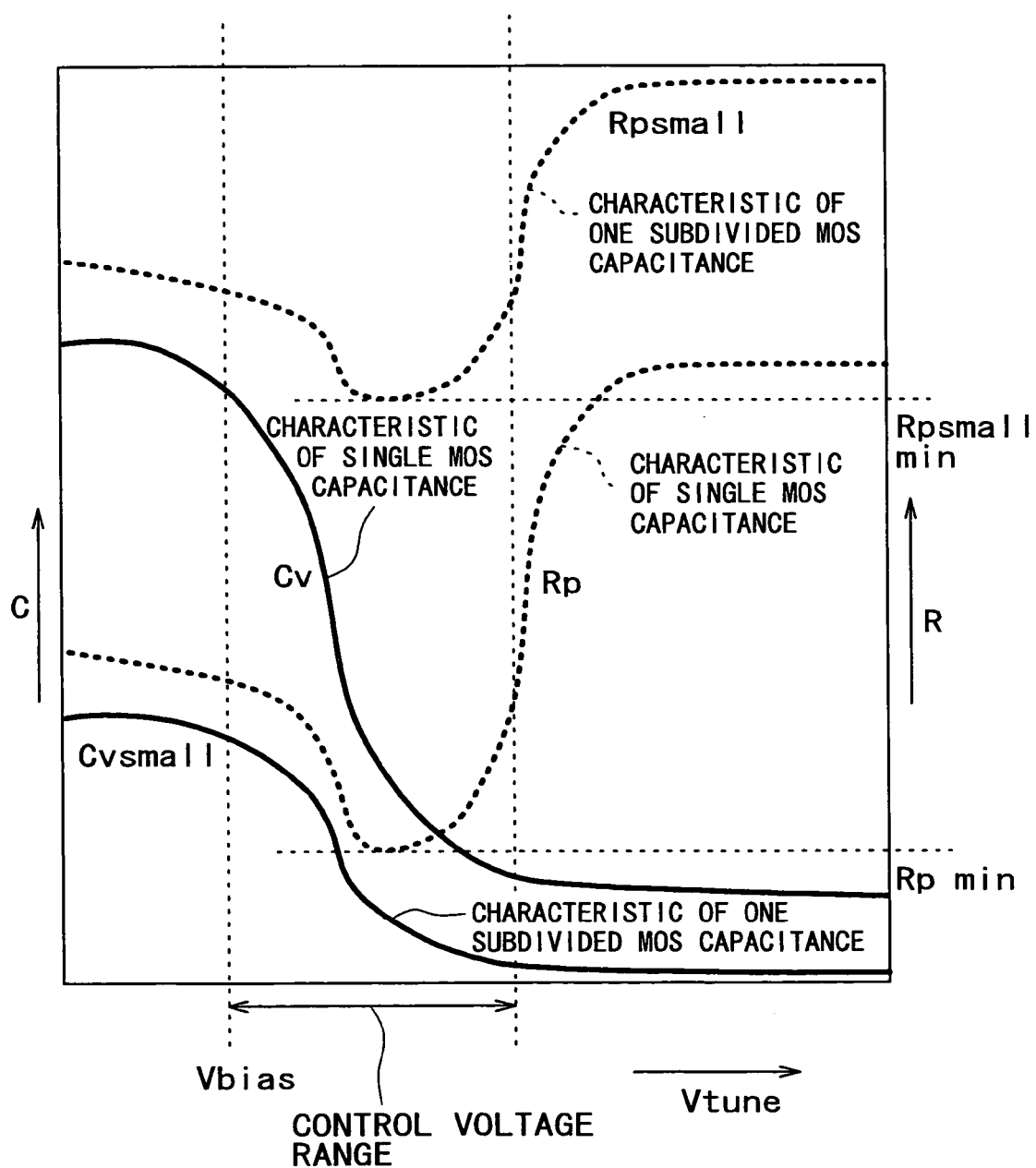
FIG. 8C graphically shows the capacitance characteristics of both transistors in FIGS. 8A and 8B.
Figure 9A:
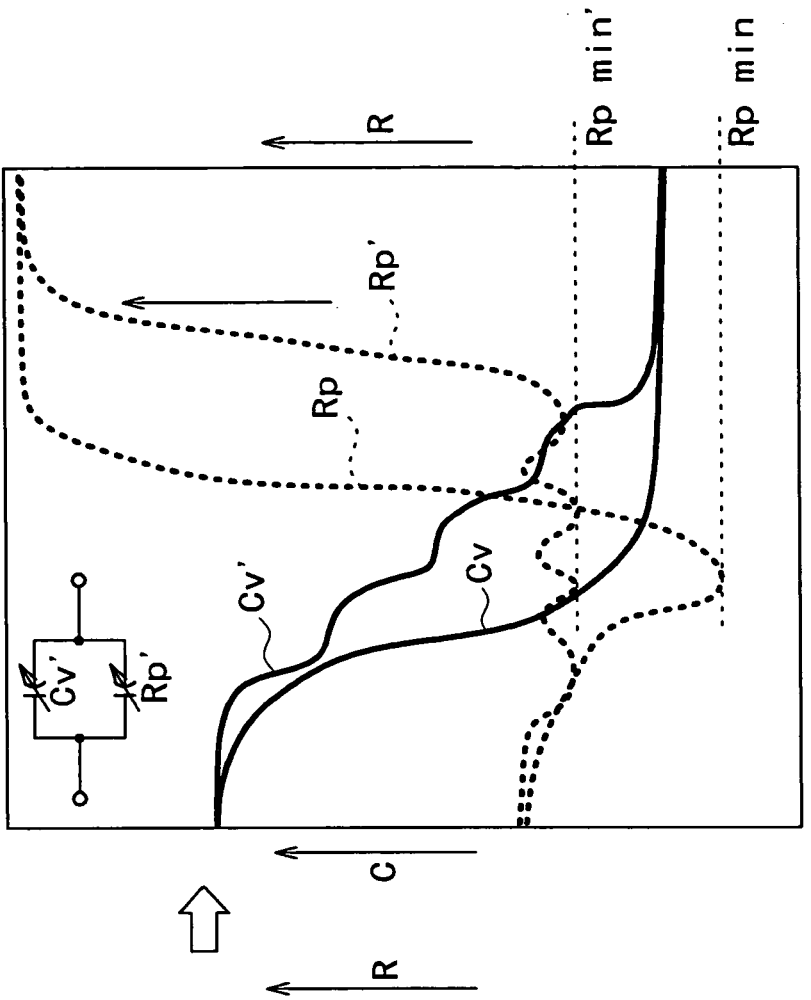
FIG. 9A graphically shows how the characteristic of each transistor is offset to the control voltage Vtune when the MOS transistor is subdivided.

FIG. 8A shows a variable capacitance circuit comprising a single transistor, and FIG. 8B shows a variable capacitance circuit comprising subdivided transistors, wherein w denotes a gate width, and l (small ell) denotes a channel length. FIG. 8C graphically shows the capacitance characteristics of both transistors in FIGS. 8A and 8B. As described above, the change point of the MOS capacitance value toward decrease is determined by the potential difference between the gate and the source, so that if mutually different DC bias voltages are applied previously to the respective gates of the subdivided transistors in FIG. 8B, then the capacitance change start voltages depending on the control voltage (=Vtune) for the four subdivided transistors are rendered mutually different. For example, if the DC potentials to be applied previously are raised stepwise like a staircase, the change characteristics of the capacitances Cv due to the individual transistors are offset to the control voltage Vtune, as shown in FIG. 9A. When these transistors are connected in parallel, there is obtained Cv'=Cv1+Cv2+Cv3+Cv4, hence widening the variable voltage range as graphically represented by Cv' in FIG. 9B.

Figure 9B:
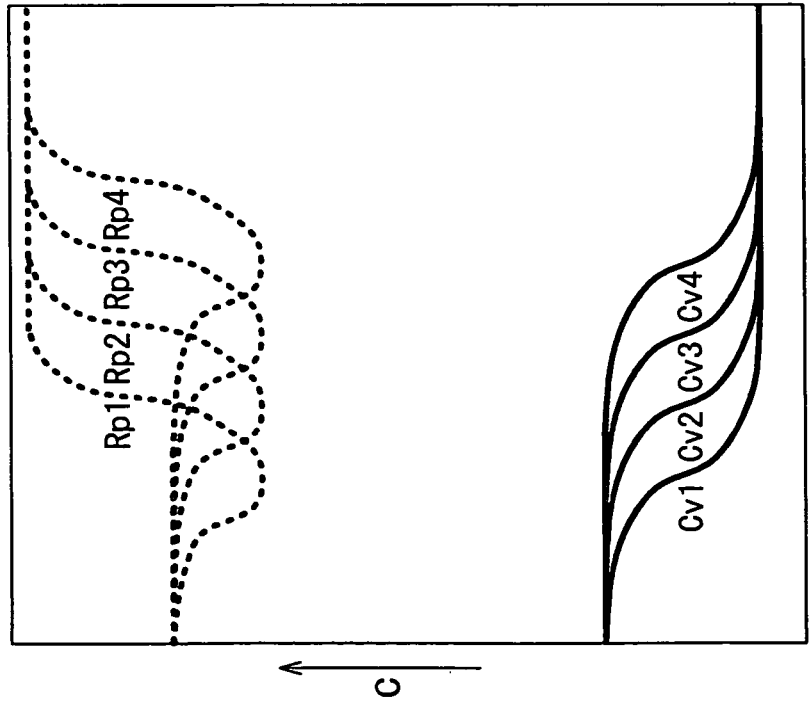
FIG. 9B graphically shows the composite characteristics thereof.

Also, the change characteristics of the resistances Rp due to the individual transistors are offset to the control voltage Vtune, as shown in FIG. 9A. The equivalent parallel resistance Rp is expressed as $Rp'=1/\{1/Rp1+1/Rp2+1/Rp3+1/Rp4\}$ Therefore, in comparison with the resistance Rp obtained without any gate bias offset, the equivalent parallel resistance Rp' obtained through the gate bias offset by using a multiplicity of transistors is advantageous in the point that, as shown in FIG. 9B, its minimum value can be increased from Rpmin to Rpmin', hence improving the Q.

Figure 1:
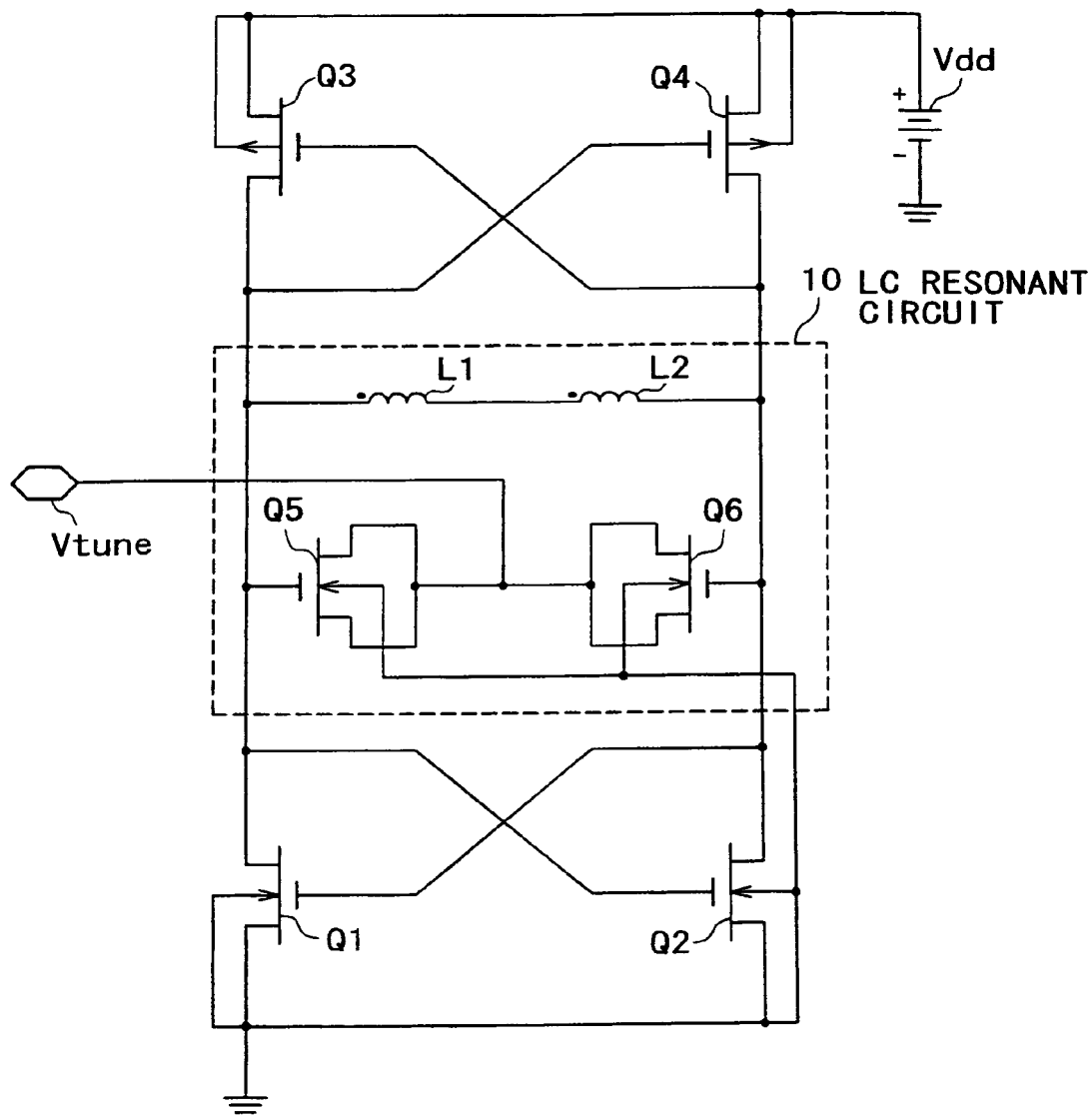
FIG. 1 is a circuit diagram showing a circuit configuration of a known LC resonance type voltage-controlled oscillator used generally heretofore.
Figure 2:
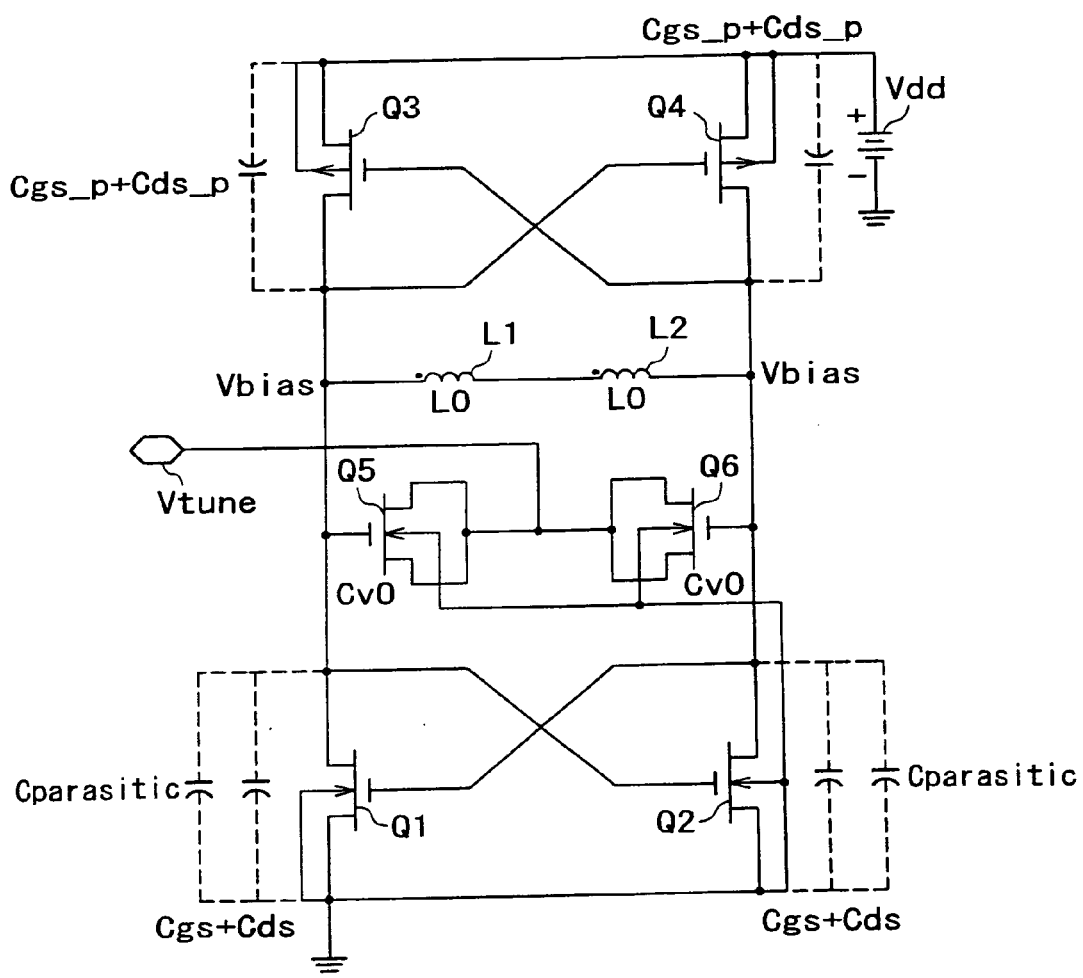
FIG. 2 is an explanatory diagram regarding the capacitance and the inductance of each component part in the oscillator of FIG. 1.
Figure 3:
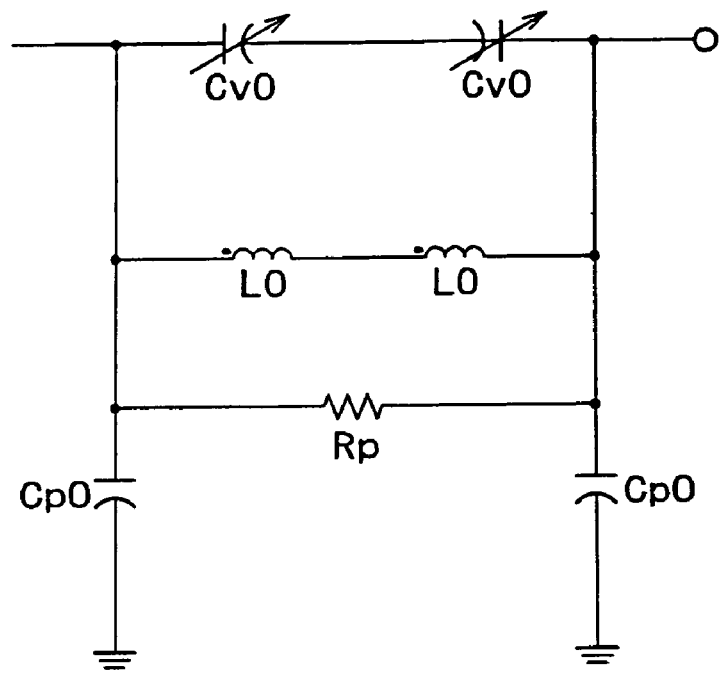
FIG. 3 is an equivalent circuit corresponding to the resonant circuit in the oscillator of FIG. 2.
Figure 4:
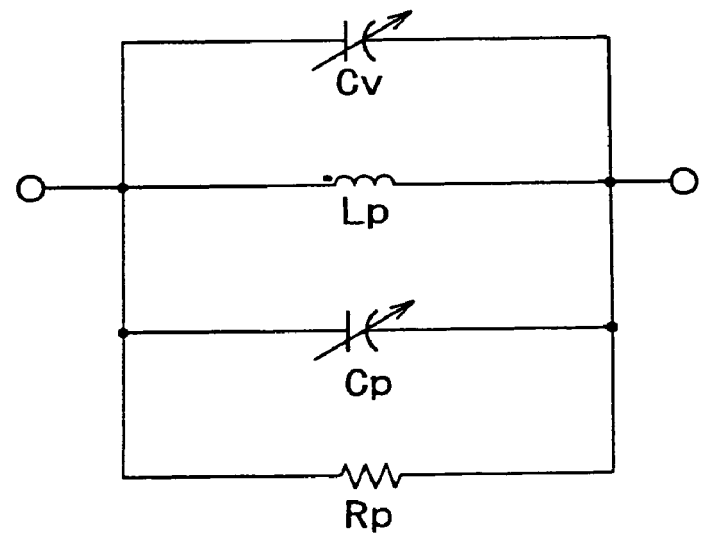
FIG. 4 is a simplified circuit diagram of the equivalent circuit shown in FIG. 3.
Figure 10B:
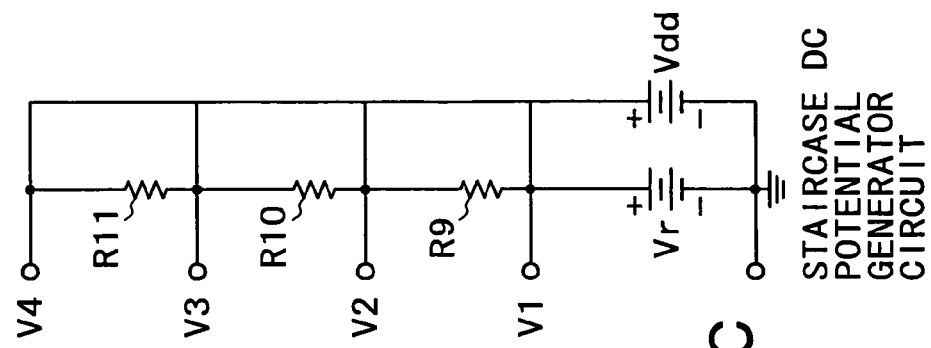
FIGS. 10A to 10C are circuit diagrams each showing a bias connection example of a resonant circuit for realizing the improvement explained in regard to FIGS. 9A and 9B.
Figure 10C:
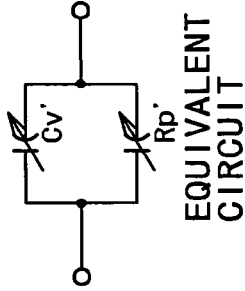
Figure 10A:
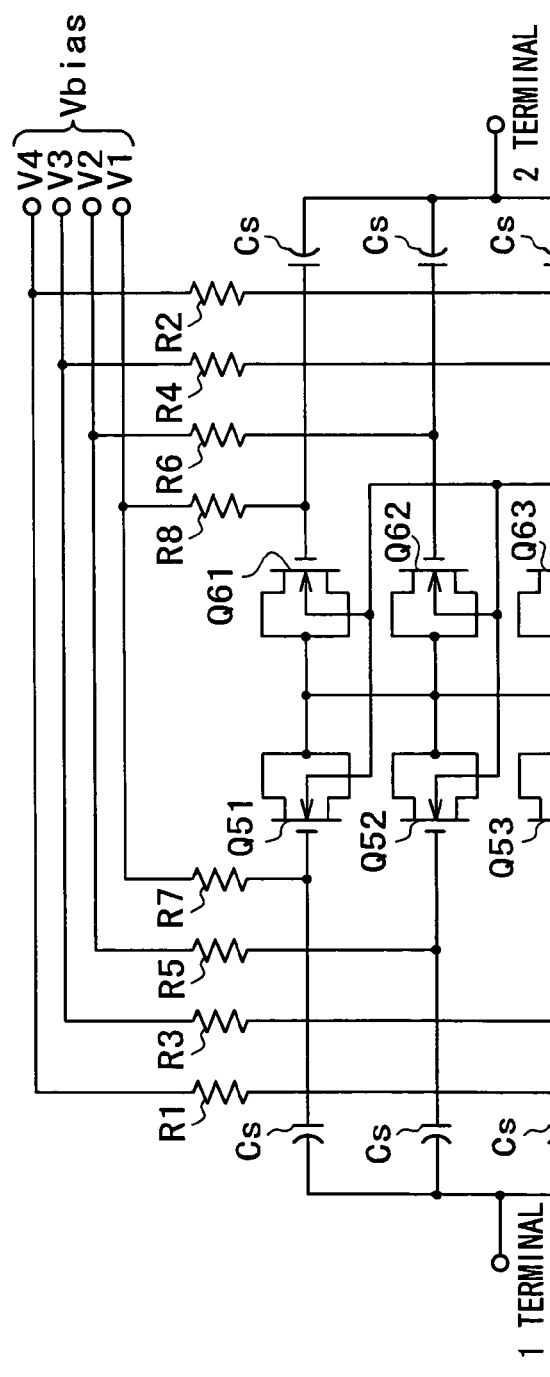

FIGS. 10A to 10C are circuit diagrams each showing a bias connection example of a resonant circuit contrived for realizing the improvement mentioned. In FIG. 10A, the capacitance of a variable capacitance circuit due to MOS transistors is changed between a terminal 1 and a terminal 2. That is, in response to a potential change caused at a Vtune terminal from a low DC potential to a high DC potential, the capacitance is changed from a large value to a small one. Since a DC bias voltage is applied from the oscillation circuit to the terminals 1 and 2 as shown in FIG. 1, a series capacitance Cs is connected for cutting the DC bias voltage from the gate of each transistor, so that mutually different DC bias voltages V1 to V4 are applied respectively to the gates of the MOS transistors Q51 to Q54 (and also Q61 to Q64). In this case, the series capacitance Cs is such that a relationship of Cv<<Cs is kept so as not to affect the variable capacitance value Cv.

As shown in FIG. 10B, a circuit for generating staircase DC voltages V1 to V4 can be realized with facility by using low voltage supplies Vdd, Vr and resistance dividers R9 to R11. The DC voltages V1 to V4 generated in this circuit are connected via resistors R1 to R8 to the respective gates of the MOS transistors constituting the variable capacitance circuit. Substantially none of DC current flows in the gate of each MOS transistor. Therefore, the resistance values of the resistors R1 to R8 are allowed to be sufficiently large so as not to lower the Q of the MOS capacitance alternatingly. An equivalent circuit corresponding to the circuit of FIG. 10A is shown in FIG. 10C.

Figure 11:
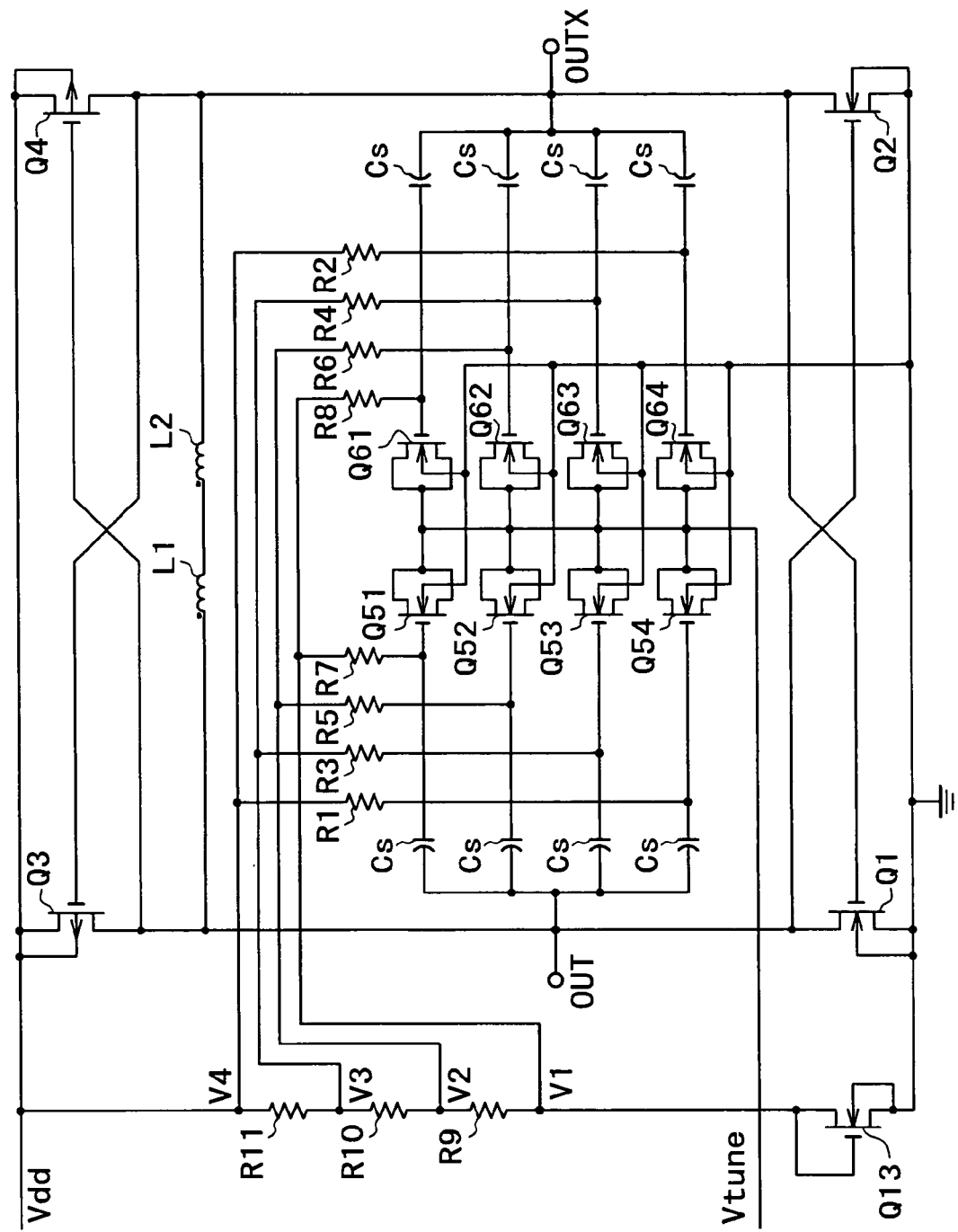
FIG. 11 is a circuit diagram of a voltage-controlled oscillator according to the present invention.

FIG. 11 is an exemplary circuit diagram of a voltage-controlled oscillator according to the present invention. The variable capacitance circuit (MOS transistors Q51 to Q54, Q61 to Q64), where multiple MOS capacitances are connected in parallel as explained with reference to FIG. 10, is connected to first and second negative resistance circuits of a differential structure comprising the MOS transistors Q1 to Q4 as explained with reference to FIG. 1, and a fixed inductance element comprising inductance elements L1 and L2 is connected in parallel thereto. In the first negative resistance circuit, the source of the nMOS transistor Q1 is grounded, and the drain thereof is connected to a non-inverted output end OUT and also to the gate of the nMOS transistor Q2. The source of the nMOS transistor Q2 is grounded, and the drain thereof is connected to an inverted output end OUTX and also to the gate of the nMOS transistor Q1. In the second negative resistance circuit, the drain of the pMOS transistor Q3 is connected to the non-inverted output end OUT and also to the gate of the pMOS transistor Q4, while the source thereof is connected to the power supply Vdd. The drain of the pMOS transistor Q4 is connected to the inverted output end OUTX and also to the gate of the pMOS transistor Q3, while the source thereof is connected to the power supply Vdd. The DC voltages V1 to V4 divided in the voltage divider as explained with reference to FIG. 10B are applied as fixed bias voltages respectively to the gates of the nMOS transistors consisting of the pair of Q51 and Q61 to the pair of Q54 and Q64. In the example of FIG. 11, the power supply Vr is constituted of a constant voltage circuit comprising an nMOS transistor Q13.

The oscillation frequency of the oscillator is decided by the parallel resonance frequency which is determined by the above circuit elements, the capacitance of the negative resistance circuit, the capacitance of the wiring, and the input capacitance of a buffer amplifier connected to the output terminal. The oscillation output is obtained from the non-inverted output end OUT and the inverted output end OUTX.

In the structure of FIG. 11, the voltage V1 is determined by the total resistance value of the resistors R9 to R11, the supply voltage Vdd and the transistor size of the MOS transistor Q13, so that it becomes possible to adjust and control the capacitance variation start point, which is dependent on the control voltage Vtune shown in FIGS. 9A and 9B, particularly by setting the size of the MOS transistor Q13 to an adequate value. Since the control voltage Vtune is connected to the drain-source common junctions of the MOS transistors Q51 to Q54 and Q61 to Q64, the DC input impedance of the resonant circuit is substantially infinite as viewed from a control voltage generator (not shown) such as a charge pump circuit for generating the control voltage, whereby the load on the charge circuit can be reduced. If the number of dividing the pairs of MOS transistors as variable capacitance elements is increased to more than five, the capacitance variation curve can be rendered smoother. In this case, however, it is necessary to ensure a proper balance therebetween since the Q of the variable capacitance circuit is lowered when multiple resistors (e.g., R1 to R8 in FIG. 11) of high resistance values for the bias are connected in parallel.

Figure 15:
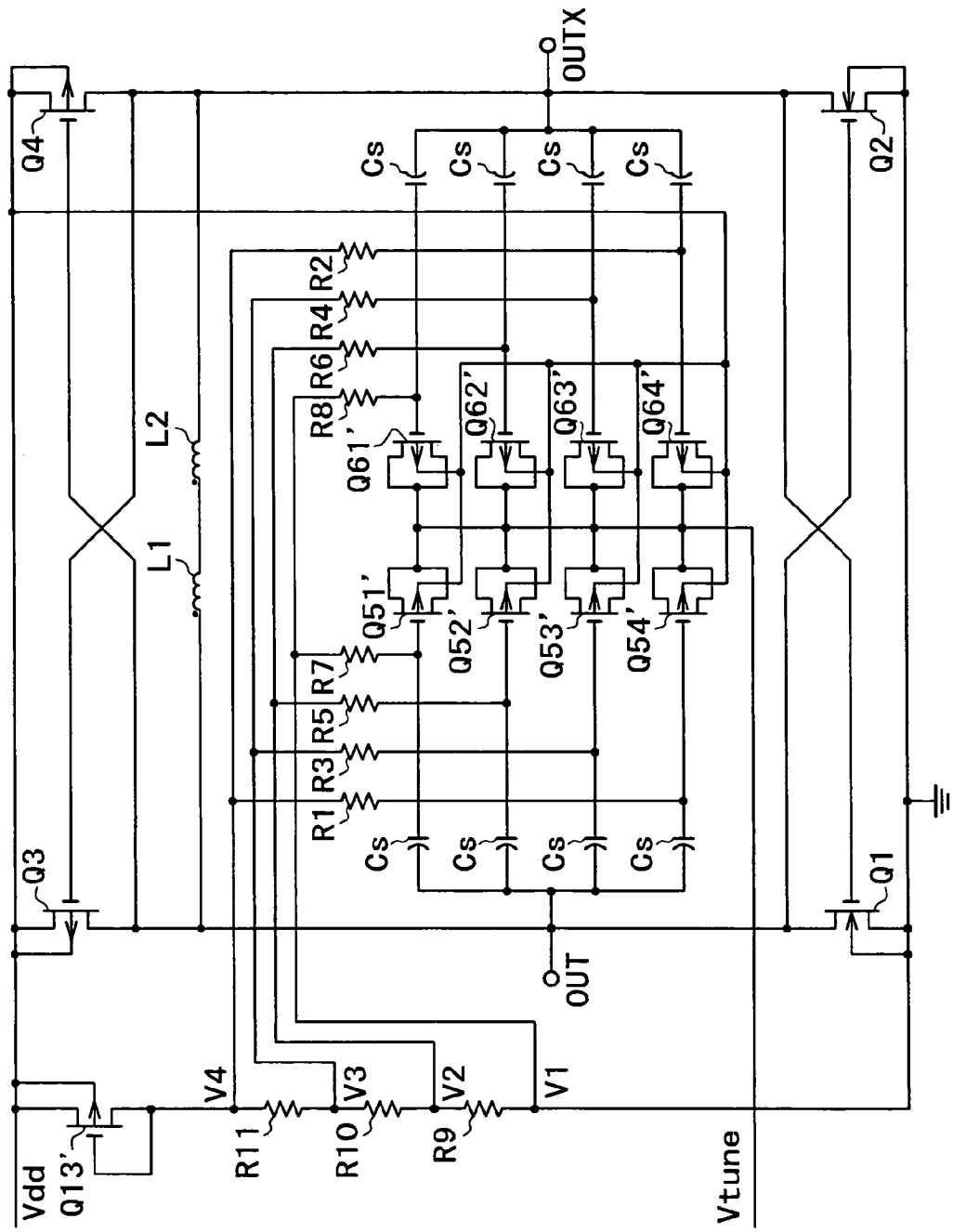
FIG. 15 is a circuit diagram for explaining still another modification of the voltage-controlled oscillator according to the invention.

As shown in FIG. 15, the MOS transistors constituting variable capacitance elements in the resonant circuit may consist of pMOS transistors Q51' to Q54' and Q61' to Q64' as well. Further, the MOS transistor constituting a constant current circuit may consist of a pMOS transistor Q13'.

Figure 12:
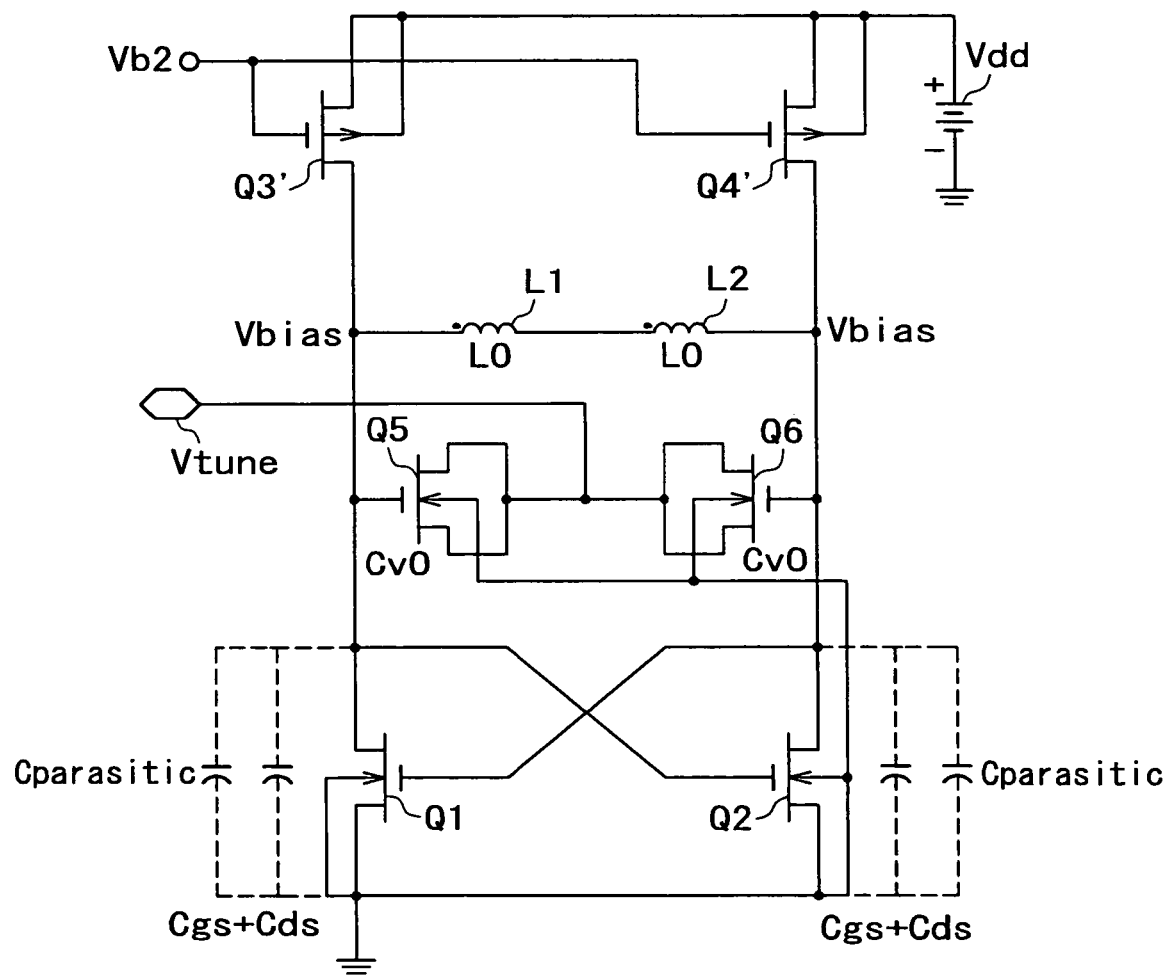
FIG. 12 is a circuit diagram for explaining a modification of the voltage-controlled oscillator according to the invention.

The second negative resistance circuit comprising the MOS transistors Q3 and Q4 in the voltage-controlled oscillator shown in FIG. 11 and so forth may be replaced with a current source comprising MOS transistors Q3'and Q4'shown in FIG. 12. The resonant circuit of the present invention shown in FIGS. 10A–10C is applicable to a resonant circuit of FIG. 12. The structure of FIGS. 10A–10C has more advantageous effects for achieving an enhanced condition of oscillation since it employs the second negative resistance circuit in addition to the first negative resistance circuit.

Figure 13:
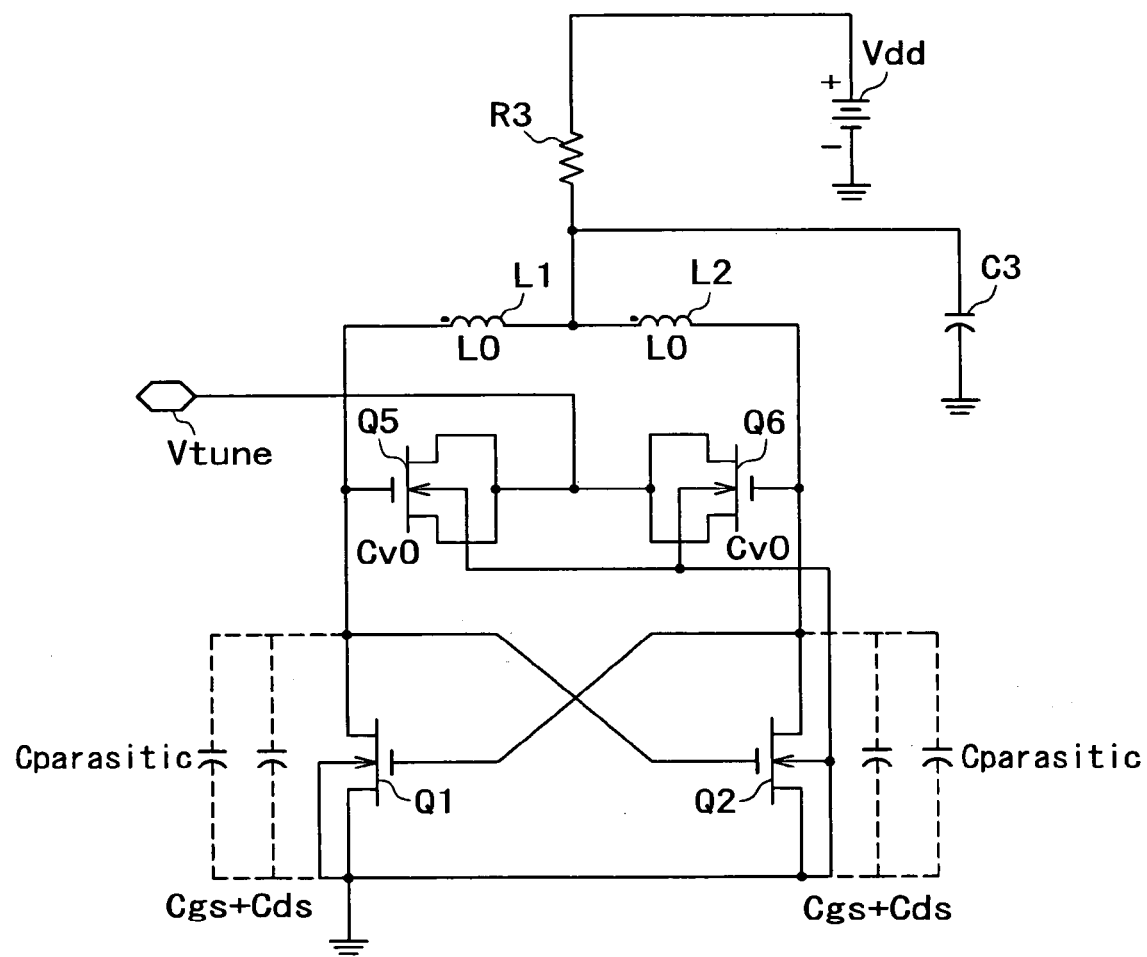
FIG. 13 is a circuit diagram for explaining another modification of the voltage-controlled oscillator according to the invention.

Moreover, the negative resistance circuit comprising the MOS transistors Q3 and Q4 in the voltage-controlled circuit shown in FIG. 11 and so forth may be replaced with a bias circuit consisting of a resistor R3 and a capacitor C3 as shown in FIG. 13. In this case also, the resonant circuit of the present invention shown in FIG. 10 is applicable to a resonant circuit of FIG. 13.

Further, the negative resistance circuit comprising the MOS transistors Qi and Q2 in the voltage-controlled circuit shown in FIG. 11 and so forth may be replaced with a negative resistance circuit of a differential structure employing bipolar transistors, wherein this circuit comprises, as shown in FIG. 14, transistors Q21 and Q22, resistors R21 and R22, and capacitors C2 1 and C22. In this case also, the resonant circuit of the present invention shown in FIGS. 10A–10C may be applied to a resonant circuit of FIG. 14.

The resistors R21, R22 and the capacitors C2 1, C22 constitute a circuit for supplying a DC bias to the transistors. Although such DC bias circuit is required also in the aforementioned negative resistance circuit using MOS transistors, it is omitted in the diagram since it is known well to any person skilled in the art and is not needed for understanding the action of alternating oscillation.

While a preferred embodiment of the invention has been described using specific terms, such description is for illustrative purposes only, and it is to be understood that changes and variations may be made without departing from the spirit or scope of the following claims.

What is claimed is:

1. A resonant circuit, comprising;
an induction element; and
a MOS variable capacitance element connected in parallel with said induction element, wherein
said MOS variable capacitance element is divided into a plurality of elements which are connected in parallel with each other, and a plurality of bias terminals are provided for applying staircase different-step DC bias voltages respectively to gates of MOS transistors constituting the plural divided MOS variable capacitance elements, and
said plural MOS variable capacitance elements have a common terminal to which a common control voltage is applied.

2. The resonant circuit according to claim 1, wherein each of said subdivided variable capacitance elements consists of a pair of MOS transistors whose drains and sources are connected in common, and the common control voltage is applied to the drain-source junction.

3. A voltage-controlled oscillator,
a resonant circuit comprising an induction element and a MOS variable capacitance element connected in parallel with said induction element; and
a negative resistance circuit of a differential structure connected to said resonant circuit,
wherein said MOS variable capacitance element consists of a plurality of divided MOS variable capacitance elements connected in parallel with each other and having a common tennis to which a common control voltage is applied,
said oscillator further having a means for generating staircase different-step DC bias voltages to be applied respectively to the gates of MOS transistors which constitute said plurality of divided MOS variable capacitance elements.

4. The voltage-controlled oscillator according to claim 3, wherein each of said divided MOS variable capacitance elements consists of a pair of MOS transistors whose drains and sources are connected in common, and the common control voltage is applied to the drain-source junction.

5. The voltage-controlled oscillator according to claim 3, wherein a fixed capacitance is inserted between the junction of each divided MOS variable capacitance element and said negative resistance circuit, and the gate of each subdivided MOS variable capacitance element, so as to separate each of said divided MOS variable capacitance elements from the DC voltage applied to said negative resistance circuit of a differential structure.

6. The voltage-controlled oscillator according to claim 3, wherein said means for generating staircase different-step DC bias voltages consists of a voltage division circuit having a plurality of series-connected resistors to divide a supply voltage.

7. The voltage-controlled oscillator according to claim 3, wherein said negative resistance circuit has a pair of MOS transistors, and the drain of one MOS transistor is connected to the gate of the other MOS transistor, and the drains of both MOS transistors are connected to the differential output end of said resonant circuit.

8. The voltage-controlled oscillator according to claim 7, further having a second negative resistance circuit connected between a power supply and said resonant circuit.

* * * * *

UNITED STATES PATENT AND TRADEMARK OFFICE
CERTIFICATE OF CORRECTION

PATENT NO. : 7,183,870 B2  Page 1 of 1
APPLICATION NO. : 10/893955
DATED : February 27, 2007
INVENTOR(S) : Kotaro Takagi It is certified that error appears in the above-identified patent and that said Letters Patent is hereby corrected as shown below:

Column 6, line 4, change "Rp" to --Rp'--.

Column 7, line 45, change "Q3'and" to --Q3' and--.

Column 7, line 45, change "Q4'shown" to --Q4' shown--.

Column 7, line 60, change "Qi" to --Q1--.

Column 7, line 65, change " C2 1" to --C21--.

Column 8, line 1, change "C2 1" to --C21--.

Column 8, line 14, change "comprising;" to --comprising:--.

Column 8, line 33, change "A voltage-controlled oscillator" to --A voltage-controlled oscillator comprising:--.

Column 8, line 43, change "tennis" to --terminal--.

Signed and Sealed this

Thirteenth Day of November, 2007

JON W. DUDAS
*Director of the United States Patent and Trademark Office*